United States Patent [19]

Dunlop et al.

[11] Patent Number: 4,827,428

[45] Date of Patent: May 2, 1989

[54] TRANSISTOR SIZING SYSTEM FOR INTEGRATED CIRCUITS

[75] Inventors: Alfred E. Dunlop, New Providence; John P. Fishburn, North Plainfield, both of N.J.

[73] Assignee: American Telephone and Telegraph Company, AT&T Bell Laboratories, Murray Hill, N.J.

[21] Appl. No.: 798,557

[22] Filed: Nov. 15, 1985

[51] Int. Cl.$^4$ ............................................. G06F 15/60
[52] U.S. Cl. .................................. 364/491; 364/490; 364/489; 364/488
[58] Field of Search ............... 364/488, 489, 490, 491; 324/73 R, 73 AT

[56] References Cited

U.S. PATENT DOCUMENTS

| | | | |
|---|---|---|---|
| 4,198,697 | 4/1980 | Kuo et al. | 307/530 |
| 4,495,628 | 1/1985 | Zasio | 324/73 AT |
| 4,587,480 | 5/1986 | Zasio | 324/73 R |
| 4,698,760 | 10/1987 | Lembach et al. | 364/488 X |

OTHER PUBLICATIONS

"An Electrical Optimizer that Considers Physical Layout" by F. W. Obermeier et al., 25th ACM/IEEE Design Automation Conference, 1988, pp. 453-459.
"Synchronous Path Analysis in MOS Circuit Simulator," *IEEE Proc. 19th Design Automation Conf.*, V. D. Agrawal, 1982, pp. 629-635.
"Analytical Power/Timing Optimization Technique for Digital System," *IEEE Proc. 14th Design Automation Conf.*, A. E. Ruehli, Jun. 1977, pp. 142-146.
"Optimization of Digital MOS VLSI Circuits," *Proc. Chapel Hill Conf. on VLSI*, M. D. Matson, University of North Carolina, May 1985, pp. 109-126.
"Signal Delay in General RC Networks with Application to Timing Simulation of Digital Integrated Circuits," *1984 Conf. on Advanced Research in VLSI*, T. Lin et al., MIT Jan. 1984, pp. 93-99.
"Electrical Optimization of PLAs," *IEEE 22nd Design Automation Conf.*, K. S. Hedlund, 1985, pp. 681-687.
"Switch-Level Delay Models for Digital MOS VLSI," *IEEE 21st Design Automation Conf.*, J. K. Ousterhout, 1984, pp. 542-548.
"Timing Analysis for nMOS VLSI," *IEEE 20th Design Automation Conf.*, N. P. Jouppi, 1983, pp. 411-418.
"Signal Delay in RC Tree Networks," *IEEE Transactions on Computer Aided Design*, J. Rubinstein, Jul. 1983, vol. CAD-2, No. 3, pp. 202-210.

*Primary Examiner*—Parshotam S. Lall
*Assistant Examiner*—V. N. Trans
*Attorney, Agent, or Firm*—Henry T. Brendzel

[57] ABSTRACT

A method and system for improving the design of an integrated circuit by iteratively analyzing the circuit and improving it with each iteration, until a preselected constraint is met. The design improvement is realized by selecting a model for the delay through each active element of the circuit that is characterized by a convex-function of the logarithm of the active element's size. Using the convex function model, with each iteration a static timing analysis of the circuit identifies the output that most grievously violates the specified constraint. With that output selected, an analysis of the path's timing structure identifies the active element in that path whose change in size would yield the largest improvement in performance. The size of that active element is adjusted accordingly and the iteration is repeated. For further improvement, the interconnection pattern of subnetworks of the circuit is evaluated and rearranged to improve performance.

20 Claims, 5 Drawing Sheets

TRANSISTOR SIZING SYSTEM FOR INTEGRATED CIRCUITS

BACKGROUND OF THE INVENTION

This invention relates to integrated circuits and more particularly to the design and manufacture of integrated circuits that are optimized with respect to specified criteria.

Very Large Scale Integration (VLSI) is made possible by our technological ability to create electronic circuits having hundreds of thousands of transistors in a single chip. Efficient design of such VLSI circuits cannot be had without some automatic means for designing the interconnection patterns and for designing the layout of the circuits, including the creation of the active elements within the circuits. Not unexpectedly therefore, a number of products are available in the art that assist in the design of VLSI circuits. An integral part of such design tools is a means for evaluating the efficacy of the design. This includes means for measuring power consumption, speed of operation, area of the active elements, etc.

Timing analysis is one such tool, and is an important one because it is an essential element of any transistor sizing algorithm. Of course, the timing analysis is important in its own right to the designer of the circuit. In a paper titled "Synchronous Path Analysis in MOS Circuit Simulator," *IEEE Proc. 19th Design Automation Conf.*, (1982), pp. 629-635, V. Agrawal describes an algorithm for estimating the time delay through a digital circuit. It is not the first such algorithm but it is an important one because it is able to discern the presence of latches (memory) in the circuit being investigated and is able to estimate the time delay from any input to any output of the combinatorial portion of the circuit. Two other timing analyzers are the Timing Verifier (TV) program by N. Jouppi, "Timing Analysis for NMOS VLSI," *IEEE Proc. 20th Design Automation Conf.*, (June 1983), pp. 411-418, and the CRYSTAL program by J. Ousterhout, "Switch-Level Delay Models for Digital MOS VLSI," *IEEE Proc. 21st Design Automation Conf.*, (June 1984) pp. 542-548. The CRYSTAL program is available commercially from the Regents of the University of California.

The CRYSTAL and TV programs differ from the Agrawal algorithm in that they use a more detailed timing estimation method, which takes into account differing gate delays for a single gate depending upon which input the signal arrives on. The drawback of both the TV and CRYSTAL programs is that they do not handle the presence of feedback in the integrated circuits, and that excludes almost all of the digital integrated circuits that are designed and built today.

Another important aspect of integrated circuit design is the transistor sizing approach that is employed. There are, of course, many deterministic sizing approaches. One simple approach, for example, is to create all transistors in one size that satisfies the circuit's overall speed requirement. In another, more sophisticated, approach the transistor size is related to how close the transistor is to the power (battery or ground) rail. There are also a number of algorithms that size the transistors within integrated circuits based on the specific circuit design. One of the earliest was the work of Ruehli, et al., described in "Analytical Power/Timing Optimization Technique for Digital System," *IEEE Proc. 14th Design Automation Conf.*, (June 1977), pp. 142-146. They devised their own timing analyzer and with the aid of that analyzer they developed an algorithm for sizing transistors. Their timing analyzer, however, does not have the ability to recognize and deal with the presence of memory in the circuit. It also does not take into account the additional delay accruing from increasing the size of a transistor gate and thereby increasing the capacitance that needs to be driven. An algorithm that does take into account the increased gate capacitance was proposed by M. Matson in "Optimization of Digital MOS VLSI Circuits," *Proc. Chapel Hill Conf. on VLSI*, (University of North Carolina, May 1985), pp. 109-126. Matson's algorithm also uses a more accurate delay model for the active elements, which takes into account the slope of the input waveform.

The biggest drawback of Matson's algorithm and of all other known sizing algorithms is that they do not have the capability to automatically recognize and deal with feedback generally, and with memory elements in particular. This is a critical failing because essentially all digital integrated circuits are sequential circuits, and sequential circuits contain memory. Another drawback of these algorithms is their use of unnecessarily accurate optimization algorithms, which result in unacceptably show analysis of large integrated circuit designs.

It is an object of our invention to overcome the limitations of the above prior are methods with a system for designing integrated circuits that optimizes the circuits with respect to speed of operation, the area occupied by the active elements, or a combination of both.

It is another object of our invention to realize a system that assists in the design of integrated circuits by judicious sorting of subnetworks to optimize the circuits' operational speed, size of the active area, or both.

SUMMARY OF THE INVENTION

These and other objects are realized with our method and system where a subject design of an integrated circuit is iteratively analyzed and improved with each iteration, until a preselected constraint, such as speed of response, is met. The design improvement is realized by selecting a model for the delay through each active element of the circuit that is characterized by a convex function. Using the convex-function model, with each iteration a static timing analysis of the circuit is employed to identify the output that most grievously violates the specified constraint. With that output selected, an analysis of the path's timing structure identifies the active element in that path whose change in size would yield the largest improvement in performance. The size of that active element is adjusted accordingly, and the iteration is repeated.

For further improvement, at selected iterations, the interconnection pattern of subnetworks of the circuit is evaluated and rearranged to improve performance. Generally, that means that those active elements whose inputs arrive late are placed electrically closer to the output port of the subnetwork.

A more comprehensive understanding of the principles of our invention may be had from the detailed description that follows, wherein:

DETAILED DESCRIPTION

Electronic circuits can be divided into purely combinatorial circuits, and circuits that contain feedback paths. In purely combinatorial circuits, signals flow in one direction only and combine in different ways to achieve a desired logical state. In circuits that contain feedback paths, memory can be realized and the presence of memory makes the circuit a sequential circuit. It is well known that a sequential circuit can always be divided into a section containing purely combinational logic, and a section containing nothing but a plurality of basic memory elements e.g., flip-flops. Such a circuit subdivision is depicted in FIG. 1.

Figure 1:
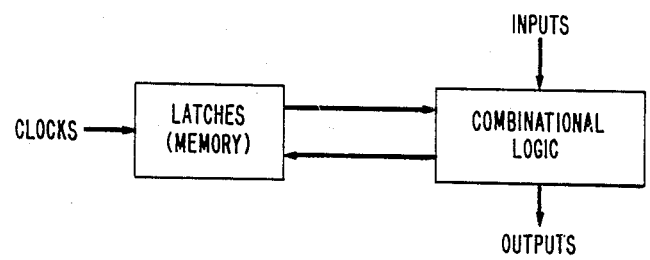
FIG. 1 is a generalized description of a digital circuit which is segmented into a combinatorial logic portion and a memory portion.

Given a circuit as shown in FIG. 1 having a total number of N transistors (e.g., MOS transistors) of sizes $x_1, x_2, \ldots, x_N$, our method improves circuit performance by adjusting the $x_i$ values. Two figures of merit are of special interest. One is T, which is the minimum clock period at which the circuit will operate or, for unclocked paths, the propagation delay. The other is A, which is simply the sum of transistor sizes or, stated differently, the total area of the active elements. It turns out that the area, A, is positively correlated with a number of other attributes of the circuit that should be minimized or constrained. First, as A increases the circuit requires more silicon area. Second, since the total gate capacitance is proportional to A, the power required to charge or discharge capacitance increases as A increases. Third, for a static CMOS gate there is a brief period of time during transition when both the pull-up and pull-down networks are partially turned on. This short-circuit power also increases with A. Likewise, a ratioed-load NMOS gate consumes more power as the pull-down transistor sizes are increased. Fourth, and perhaps most important in many situations, the probability of a device fault in a chip depends strongly on the total active area of the chip. As the active area increases the probability of chip failure increases.

The critical aspect of any method of optimization is the form of the equation or function that is optimized and, more specifically, the nature or the behavior of that function. In accordance with the principles of our invention, we seek to select a function to be minimized that yields a good result and also assures that the result is reached effectively and expeditiously. That means that the result would be close to the absolute minimum, would be reached quickly, and the process would not get "stuck" at some local minimum of the function. With integrated circuits having hundreds of thousands of transistors, an optimization process that achieves its end results expeditiously is not a luxury but an absolute necessity.

Thus, as a preliminary step, the attribute that is to be optimized and the constraint that is to be imposed must be selected. We consider three formulations:

(1) minimize the area of the active elements in the integrated circuit subject of the constraint that the maximum delay at any output is less than a preselected constant, T;

(2) minimize the maximum delay at any output subject to the constraint that the area of the active elements is less than a preselected constant; and (3) minimize the factor $AT^K$ where K is a constant.

The first formulation is probably the most useful one because often the desired speed of operation (clock frequency) is given. In such a case, the first formulation can be used to fit the circuit within a system with a given clock period T. Also, unlike the other two formulations, two different circuits that are optimized separately with the same value of T are also optimal when considered jointly. This fact allows subcircuits to be optimized separately without loss of optimality in the final circuit.

The second formulation might be used when the circuit is to be made as fast as possible, subject to constraints on silicon area, power, or yield.

The third formulation represents a holistic approach in which both A and T are important, but have relative weights assigned to them. For example, it may be that T is important enough that one might be willing to pay for a one percent decrease in T with up to a five percent increase in A. In such a circumstance, one would set K to five.

The second and, perhaps, the more important factor to be considered in pursuing the minimization process is the model used in representing the active elements of the circuit. For the case of MOSFET integrated circuits we selected the model shown in FIG. 2, where 10, 11, and 12 represent the gate, drain, and source nodes of a MOSFET, respectively. Capacitor $C_g$ (13) is the capacitance between the gate and ground, capacitor $C_d$ (14) is the capacitance between the drain and ground, and capacitor $C_s$ (16) is the capacitance between the source and ground. Switch 17 is closed when the FET is turned on, and resistor $R_{ds}$ (15) is the resistance between the drain and the source when the FET is on. The gate, source, and drain capacitances are all directly proportional to the transistor size x (channel width), while the source-to-drain resistance is inversely proportional to x.

Figure 2:
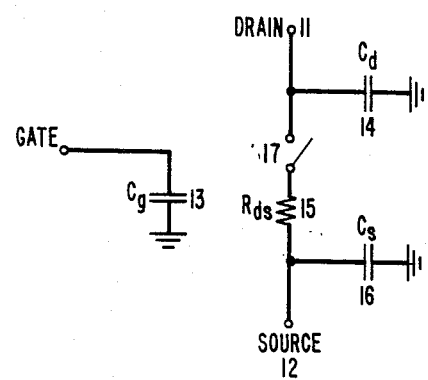
FIG. 2 illustrates the distributed RC model of an MOS transistor employed in connection with one embodiment of our invention.
Figure 3:
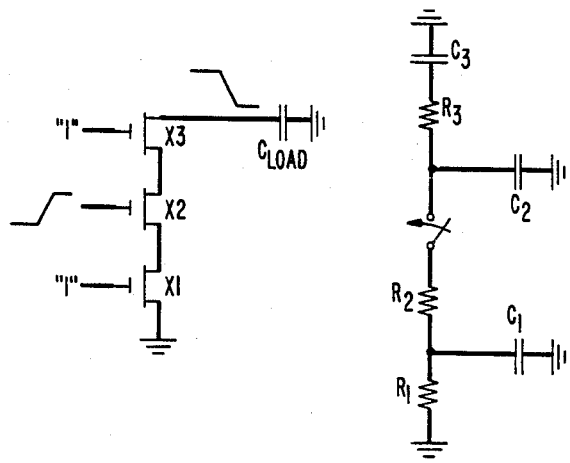
FIG. 3 describes a three transistor "totem pole" interconnection, and the equivalent circuit that describes the delay through the circuit.

FIG. 3 illustrates the modeling of gate delay, in accordance with the distributed RC model of FIG. 2, for a "totem-pole" arrangement of three FETs. The Penfield-Rubinstein distributed RC model implies that an upper bound for the discharge time of the FIG. 3 circuit is $$(R_1+R_2)C_2+(R_1+R_2+R_3)C_3, \qquad (1)$$

where $R_1$, $R_2$, and $R_3$ are equal to the $R_{ds}$ resistances of transistors $x_1$, $x_2$, and $x_3$, respectively, $C_1$ is equal to $C_d$ of transistor $x_1$ plus $C_s$ of transistor $x_2$, $C_2$ is equal to $C_d$ of transistor $x_2$, plus $C_s$ of transistor $x_3$, and $C_3$ is $C_d$ of transistor $x_3$ and $C_L$. It may be noted that $C_1$ is below the closing switch and it speeds the gate's operation rather than slowing it down upon closure of the switch. This can clearly be seen when it is observed that the initial current flow sinks into capacitor $C_1$, which appears as a short circuit, and no current flows through resistor $R_1$. Hence, in assessing an upper bound on the delay (as above), $C_1$ can be neglected and therefore $C_1$ does not appear in Equation (1).

When Equation (1) is expressed as a function of transistor sizes $x_i$, each $R_i$ is proportional to $1/x_i$ and each $C_i$ is some constant plus terms that are each proportional to some $x_i$. The constant term in $C_i$ represents the wire capacitance, and the variable term represents the capacitance of the gate, drain, or source, as the case may be. Thus, Equation (1) can be written as:

$$\left(\frac{A}{x_1} + \frac{A}{x_2}\right)(Bx_2 + Bx_3 + C) + \left(\frac{A}{x_1} + \frac{A}{x_2} + \frac{A}{x_3}\right)(Bx_3 + D), \quad (2)$$

where A, B, C, and D are constants.

Recognizing that the delay through a path is the sum of delays encountered in the path, we reach the general form of a path delay in a circuit as follows:

$$\sum_{1 \leq i,j \leq N} a_{ij} \frac{x_i}{x_j} + \sum_{1 \leq i \leq N} \frac{b_i}{x_i}, \quad (3)$$

where the $a_{ij}$ and $b_i$ are nonnegative constants that for any specific path in the circuit are mostly zero. It can be shown that the function described by Equation (3) is convex in the logarithms of the $x_i$'s, which means that any straight line segment in N+1-dimensional space whose end points lie in the graph of the function, is itself entirely on or above the graph. In addition, Equation (3) belongs to a special class of convex functions called posynomials.

As a consequence of the above, all three formulations of the constraints can be seen to be the minimization of a convex function, subject to an upper bound on another convex function. The convexity property yields enormous advantages that have not been possible to realize with the minimization functions employed in the prior art. The biggest advantage is that any point found to be a local minimum is also the global minimum.

The field of Convex Programming has been intensively explored over the last several decades and many computational techniques are available. See, for example, R. T. Rockafellar, *Convex Analysis*, (Princeton University Press 1970). As a consequence of the fact that a posynomial function is convex in the logarithms of its variables, the field of posynomial programming is a subfield of convex programming; see, e.g., J. G. Ecker, "Geometric Programming: Methods, Computations and Applications," *SIAM Review Vol. 22 No. 3*, July 1980, pp. 338-362.

Since the desired optimization is that of a part of a chip, an entire VLSI chip or perhaps an entire system, the optimization method must be as efficient as possible; even perhaps at the expense of absolute accuracy in finding the optimum. Our process, which provides an efficient method for closely approximating the optimum point, arrives at the optimized solution quite quickly by proceeding generally in accordance with the following steps.

Figure 4:
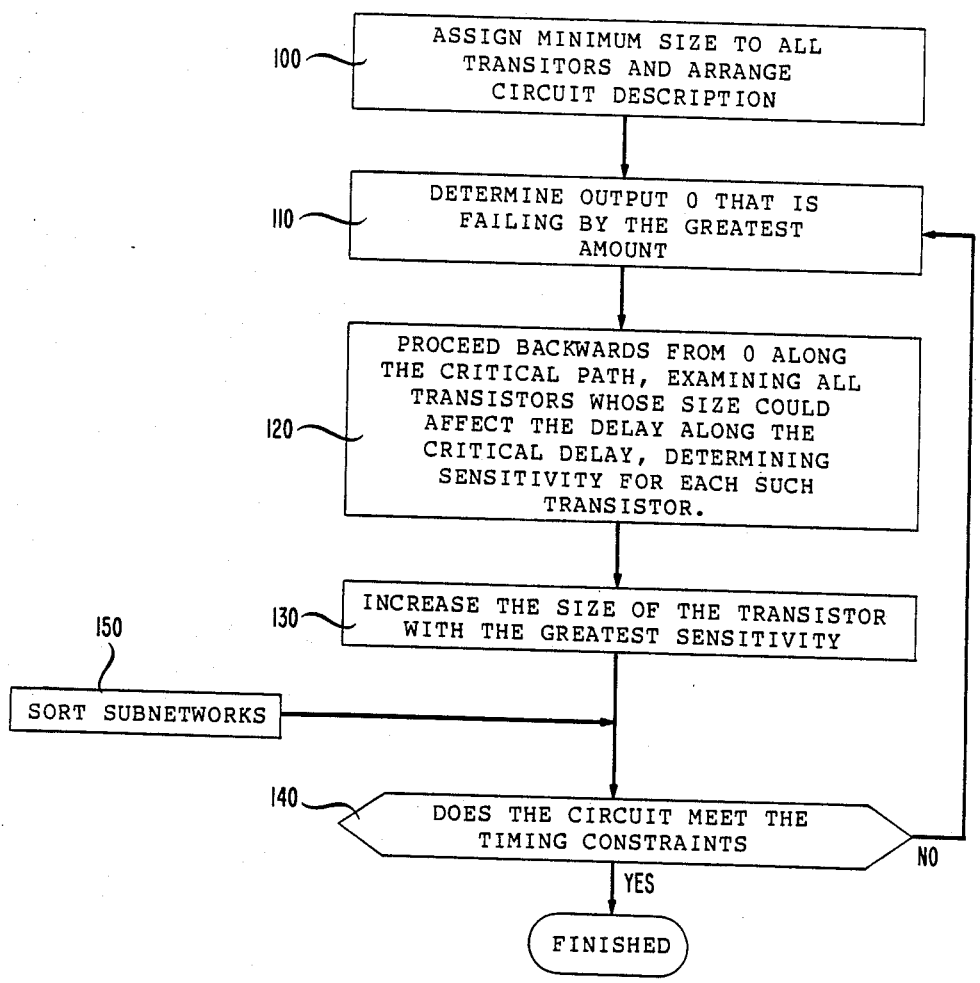
FIG. 4 is a flowchart providing a pictorial representation of the method employed in the system of our invention.

The process starts with all active elements in the VLSI circuit design being set at their minimum possible size (block 100 in FIG. 4). This results in an initial design that contains the minimum active area and is the most reliable (the larger the active area, the more probable are the chip defects in manufacturing).

Next, the circuit's description equations (specification) are arranged to conform to the FIG. 1 structure (block 100 in FIG. 4).

Following the above preliminary steps, an iterative process starts with a circuit analysis (from the specification resulting from the above step 2) to identify and select the output that fails most (block 110 in FIG. 4). By "fails most" we mean that, for example, when T is 1 microsecond, one output has a delay of 1.2 microseconds and another output has a delay of 1.5 microseconds, then the 1.5 microseconds output is selected as the output that fails most.

In the next step, the causes of the delay in the selected output are investigated by examining, in turn, each transistor which could have an effect on that output (block 120 in FIG. 4). To perform the examination, two numbers are assigned to each electrical node: $t_l$ (latest-time-to-go-low), and $t_h$ (latest-time-to-go-high). In examining a delay "failure," when $t_h$ causes the "failure," the pull-up circuitry is examined, while when $t_l$ causes the "failure," the pull-down circuitry is examined. Such examination includes both the active element under consideration and its supporting elements. Among the supporting elements are, of course, all the active elements that contribute to that element's input signal. This creates a chain-like examination that may be characterized as a "walk" backwards which identifies the critical path that controls the delay in the selected output. In FIG. 3, for example, the investigation includes all three transistors in addition to the investigation of the critical path leading to the input that happens to be the slowest.

For each such transistor, i, examined in the previous step, the time savings accruing from incrementing $x_i$ by a fixed amount if calculated. The one transistor in the critical path that offers the greatest such savings is incremented by that fixed amount (block 130 in FIG. 4).

The iterative loop is closed (in block 140 of FIG. 4) by returning to the point of output delay determination (i.e., to block 110 in FIG. 4), until either the imposed constraint is satisfied or no transformation is possible that reduces the quantity being minimized.

Since the number of paths through a circuit can be very large in comparison to the size of the circuit itself, our method realizes an advantage be never actually expanding the circuit into an enumeration of the paths. In addition, a change of a particular $x_i$ can only change two gate delays: delay of the gate that includes the altered transistor, and the delay of the gate that drives the altered transistor. Therefore, when repeating the delay calculation to find the worst output delay we recalculate only those quantities that might change as a result of the single variable change.

As indicated by the above equations, the delay curve as a function of size follows the relationship $Ax+B/x+C$ where A, B, and C are greater than 0; which means that from some minimum value of x, as x is increased the delay is decreased until some minimum delay is reached. Beyond the size of minimum delay, continuing to increase the size increases the delay.

Ordinarily, it would be expected that at no time would one wish to increase the size of a transistor beyond its minimum delay point.

However, in accordance with one aspect of our invention this is exactly what is done. The reason for that lies in the observation that the size of a transistor affects not only its speed but also the speed of its neighbors, and in the observation (made earlier in connection with FIG. 3) that in a "totem-pole" arrangement, increasing the capacitance (i.e., size) of the transistor that is located closer to a power rail reduces the delay of the switching transistor with respect to the output of the "totem pole." Thus, in accordance with this aspect of our invention a step is included in our method (within block 120) that analyzes all situations where more than one input affects an output, with an eye toward increasing the size of those transistors that affect the output earlier than the slowest input; even to the point of slowing down the signal on the gate of those transistors somewhat. It may be noted than when the size of a transistor, x, is small, the delay decreases rather rapidly with respect to increase in area. When x is large, the delay increases linearly with x, which is a relatively slower rate of increase in the delay.

Figure 5:
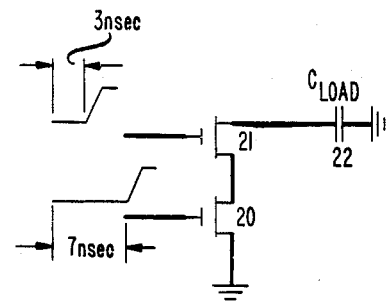
FIG. 5 illustrates a two transistor circuit arrangement where the input signals to the two transistors have different times of arrival.

In still another aspect of our invention, a step is included in our method (block 150 in FIG. 4) that sorts the order of series subnetworks of a subcircuit within the VLSI circuit in order to improve the subnetworks' performance (speed). A specific example might illustrate this best and, to that end, FIG. 5 depicts a series subnetwork of two transistors where the input to transistor 20 arrives with a 7 nsec delay and the input to transistor 21 arrives with a 3 nsec delay. In the timing arrangement illustrated in FIG. 5, if each of the capacitors (in the distributed RC model) is taken to have the value C and each of the resistors is taken to have the value R, then the output-discharge time (controlled by the slower input) is 7 nsec + R2C + 2R(C + $C_{load}$). When we reverse the input leads and the slower input is applied to transistor 21, then the output-discharge time is 7 nsec + 2R(C + $C_{load}$). The difference between these two delays, 2RC, represents the time that it takes transistor 20 to discharge the capacitance of the node between the two transistors. This discharge must take place in both configurations of the FIG. 5 circuit, but, in the latter configuration, it takes place in the "free" time interval between 3 nsec and 7 nsec, before the later input arrives.

Figure 6:
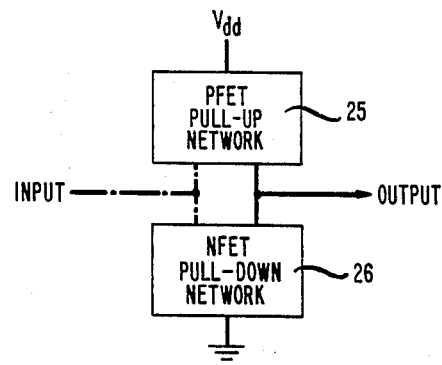
FIG. 6 describes the general structure of CMOS integrated circuits, with a PFET network being employed as a pull-up circuit and an NFET network being employed as a pull-down circuit.

Generalizing the above with reference to FIG. 6, a static CMOS complex gate consists of a pull-up network 25 and a pull-down network 26. The pull-up network contains only PFETS, and the pull-down network contains as many NFETS. The inputs to the two networks are identical, and the two networks (which are duals of each other) are connected to each other in series between $V_{dd}$ and ground. The connection between the two networks forms the output of the gate. A network with two connection points and any number of inputs can be constructed from single transistors by any recursive composition of the following three rules:

(1) A single transistor is a network. In FIG. 2, for example, the source and drain are the two connection points, and the gate is the single input of the network.
(2) Any number of networks can have their connection points connected in series to form another network (e.g., FIG. 5). The new network's inputs are the union of the inputs of the component networks. The new network's connection points are the two connection points of the components left free.
(3) Any number of networks can have their connection points connected in parallel to form another network. The new network's inputs are the union of the inputs of the component networks. The new network's connection points are the connection points of the component networks that have been connected.

Proceeding from the above, whenever a network is formed by the series composition rule from N subnetworks, the logic function computed by the network is unaffected by which of the N! subnetwork orderings is chosen. However, as was shown in the simple example of FIG. 5, the timing performance of the gate is, in general, different for different orderings. To minimize delay, our improved method orders the subnetworks according to the latest-time-to-turn-on for each subnetwork. The subnetwork with the earliest such time is placed nearest the power rail ($V_{dd}$ or ground, as the case may be), and the subnetwork with the latest such time is placed nearest the output. Given a subnetwork, this latest-time-to-turn-on is the maximum of the latest-time-to-turn-on values of the constituent transistors. The latest-time-to-turn-on of an NFET is the latest-time-to-go-high of its gate. The latest-time-to-turn-on of a PFET is the latest-time-to-go-low of its gate.

Figure 7:
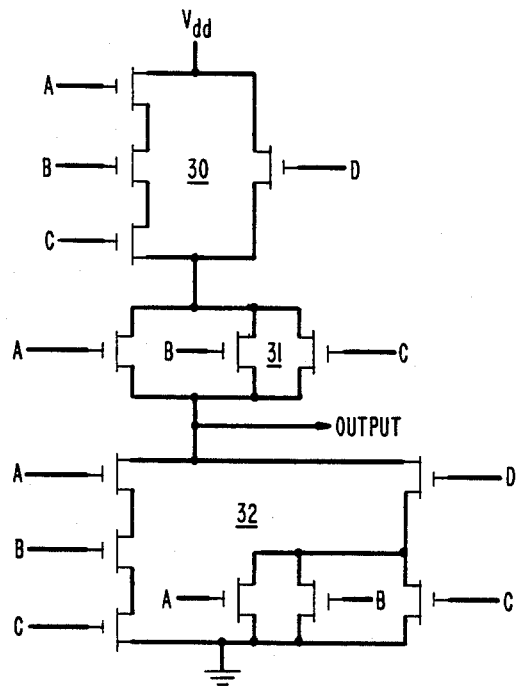
FIGS. 7 and 8 illustrate the need to sort elements within subnetworks of a circuit in order to optimize performance.
Figure 8:
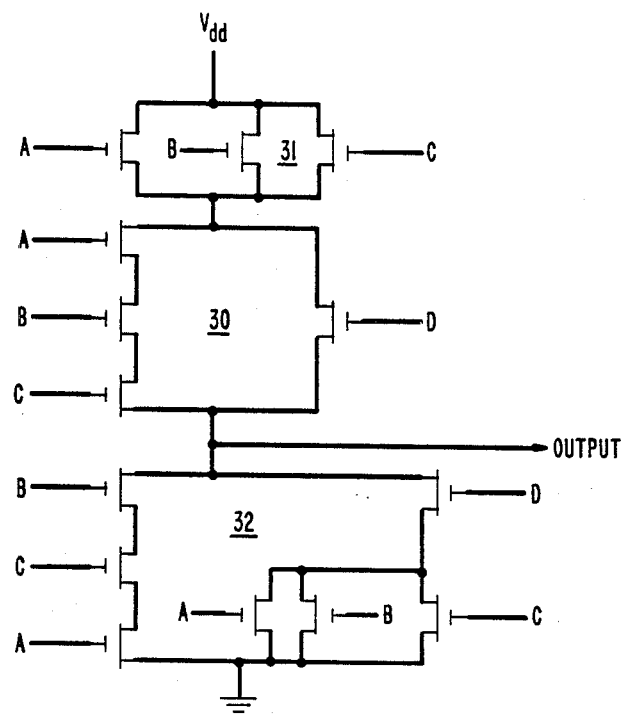

FIGS. 7 and 8 illustrate this process with a complex gate that contains 14 transistors. FIG. 7 is before sorting and FIG. 8 is after sorting. The latest-time-to-go-high and the latest-time-to-go-low of inputs A, B, C, and D are ordered $A_l < B_l < C_l < D_l$ and $A_h < C_h < B_h < D_h$. In subnetwork 30, the three transistors in series are already in optimal order: A should be closest to $V_{dd}$, since its latest-time-to-go-low is earliest, followed by B and then C. However, the pull-up is composed of subnetworks 30 and 31 in series, and these networks are in their own order; subnetwork 31, which has a latest-time-to-turn-on that is earlier than that of subnetwork 30, should be closest to $V_{dd}$. Accordingly, in FIG. 8, the positions of subnetworks 30 and 31 are reversed. Meanwhile, in the pull-down subnetwork, 32, one reordering needs to be made; and that is in the three transistors in series. Transistor B should be closest to the output followed by C, followed by A. This rearrangement within subnetwork 32 is also shown in FIG. 8.

Implementing the above method requires a combination of conventional elements that are all well known. The system implementation can be done in special purpose hardware or in a system comprising generalized circuits that are software controlled. With present day technology the latter approach may be easier to realize, particularly since a number of the steps called for are algorithmic in nature and are available in the art in software form.

Figure 9:
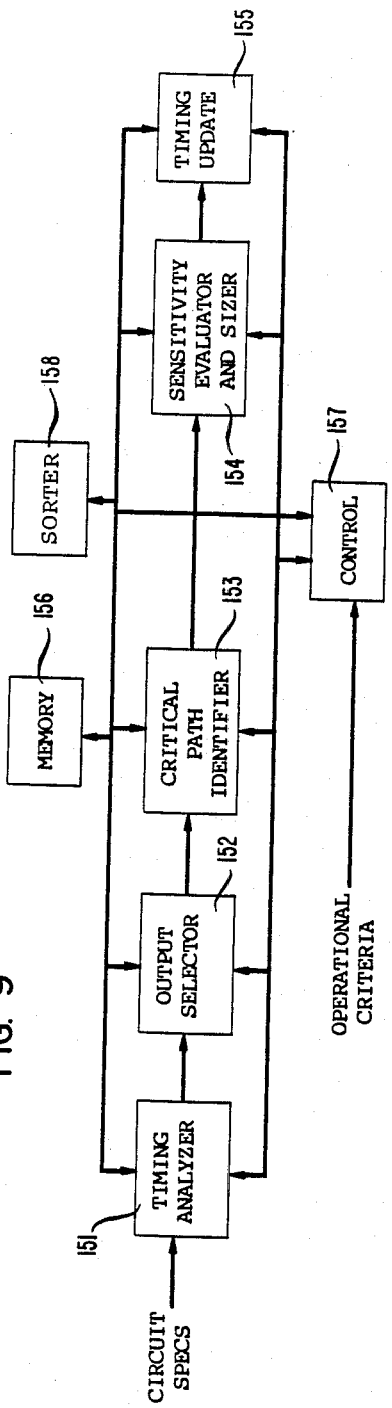
FIGS. 9 depicts a system embodiment of our invention.

The structure of a system embodying the principles of our invention is shown in FIG. 9. Block 151 is a timing analyzer which receives as input the specification of the circuit whose layout is to be optimized. It contains a model representing the active elements of the circuit which yields a convex delay function. With the aid of that model and under control of block 157, block 151 analyzes the specification (as taught, for example, by V. Agrawal) and develops a table that correlates the outputs of the circuit with approximated time delays. That table is stored in memory 156. Control then passes to block 152 which obtains the speed criteria to be satisfied from control block 157 and selects that output from the table created by block 151 which fails the speed criteria by the greatest amount. Control then passes to block 153, where a critical path associated with the selected output is identified. Each active element in the identified critical path is evaluated to determine its sensitivity to changes in size by evaluating the incremental change in delay for a given incremental change in size (from the existing size). It may be noted here that all active elements begin with some initial minimum size. The active element that is found to have the greatest incremental improvement in delay is selected, and its changed size specification is noted in another table within memory 156. Control then passes to block 155, where the effect on output delays caused by the change in size effected by block 155 is evaluated. The results of this evaluation are fed to block 157, where the resultant collection of circuit output delays and active element sizes (from the tables in memory 156) is compared to the operational criteria provided to block 157. Control is returned to block 152 until the criteria are met. As discussed above, the operational criteria considered (within block 157) can be minimizing the integrated circuit area subject to the requirement that a certain speed is achieved, minimizing the delay through the circuit subject to the requirement that integrated circuit's area should not exceed a certain value; or a combination of the above. Other criteria can, of course, be also accommodated.

The above concentrates on the system aspects of an embodiment incorporating the principles of our invention. To provide further assistance, the following concentrates on the method steps that may be employed to carry out the principles of our invention.

The step of selecting the minimum size of transistors is taken simply on the advice of the integrated circuit manufacturer. The step of separating a circuit's specification into a combinatorial portion and a memory is well known and, indeed, the aforementioned Agrawal timing analyzer incorporates this step and therefore can be used in the implementation of our system and method. As in some prior art applications, the outputs of the combinatorial portion that go solely to the memory are, nevertheless, treated as outputs, the delays of which are considered as described above.

The output of the timing analyzer is a table that correlates the circuits' outputs to the delay of those outputs. From this table, the worst output is selected and the "walk" backwards begins. Based on the specification of the subnetwork developing the worst output, with the aid of the distributed RC model, the effect of each transistor in that subnetwork is computed. Also, the input to the subnetwork that constitutes the critical input as far as delay is concerned is identified. The transistor in the subnetwork that is found to yield the largest improvement in performance is remembered and the process continues with the analysis of the subnetwork that feeds the critical input. With each subnetwork analysis, a transistor offering the largest improvement in performance is compared with the remembered transistor, and the one offering the larger improvement in performance is kept. As a consequence, when the entire critical path (of the worst output) has been analyzed, the transistor remembered is the one within the entire critical path that offers the largest improvement in performance. The size of that transistor is altered and an updated timing analysis of that output is performed and placed in the table. The process is then reiterated with a new worst output selected and analyzed.

Every 30 iterations, a sorting process is initiated. The sorting itself is completely conventional. Each logic subnetwork has a limited number of inputs which generally is relatively small (e.g., <10) and the number of possible permutations is therefore manageable. Each subnetwork in the critical path is evaluated and a sorting of the inputs is suggested based on the latest-time-to-turn-on of each subnetwork.

A simple "bubble-sort" algorithm is employed to effect the actual subnetwork sorting.

Figure 10:
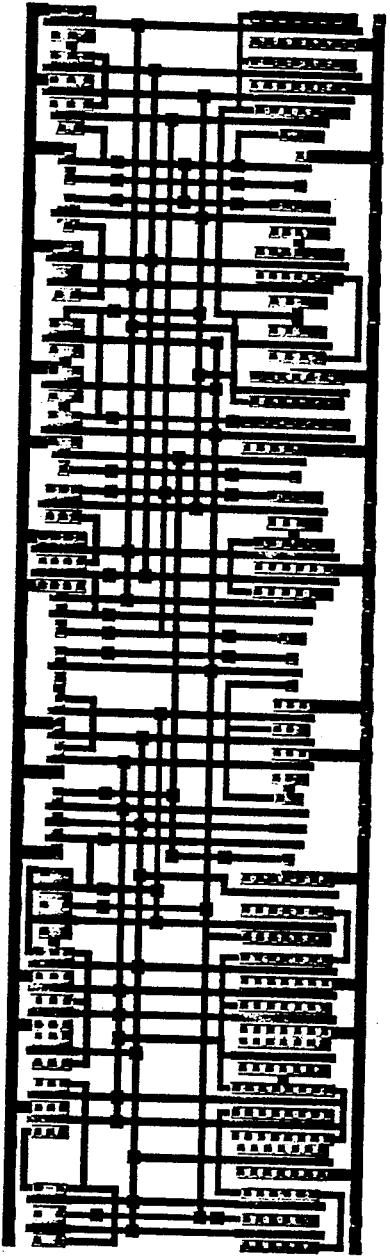
FIG. 10 shows the layout of a portion of an integrated circuit, realized in accordance with the principles of our invention.

FIG. 10 illustrates a sample layout that results from application of our invention. Shown are MOS transistors with different sizes (channel widths) that were determined to yield, in combination, the maximum speed in a given area.

What is claimed is:

1. An integrated circuit comprising memory elements, input ports, output ports and a plurality of active elements constructed in accordance with a layout arrangement where at least one of said output ports is a critical output port that develops output signals with a delay that essentially is at a preselected maximum level, where each of said critical output ports has an associated critical path that contains those of said active elements whose size variations affect the signal delay of said critical output, and wherein at least some of said active elements in said critical paths are at sizes greater than a minimum size, said active element sizes being selected such that reducing the size of any active element in said critical paths causes the signal delay of at least one of said critical output ports to exceed said preselected maximum delay.

2. A method for altering a given layout of an integrated circuit comprising the steps of:
   designating said given layout as the current layout;
   performing a timing analysis of said current layout to identify and output port of said integrated circuit that has a slower response than all other output ports of said integrated circuit;
   performing a sensitivity analysis on the identified output port to locate an active element of said integrated circuit whose change in size improves the speed of response of said identified output port by the greatest amount;
   automatically altering the size of said located active element; and
   designating the layout resulting from said altering as the current layout and reiterating through the steps of this method until preselected criteria are met.

3. The method of claim 2 wherein said circuit includes feedback.

4. The method of claim 2 wherein said circuit includes memory elements.

5. An integrated circuit having input ports, output ports, and active elements therebetween, embedded in a layout developed in accordance with a method comprising the steps of:
   designating said given layout as the current layout;
   performing a timing analysis of said current layout to identify an output port of said integrated circuit that has a slower response than all other output ports of said integrated circuit;
   performing a sensitivity analysis on the identified output port to locate an active element of said integrated circuit whose change in size improves the speed of response of said identified output port by the greatest amount;
   altering the size of said located active element; and designating the layout resulting from said altering as the current layout and reiterating through the steps of this method until preselected criteria are met.

6. An integrated circuit having input ports, output ports, and active elements therebetween, embedded in a layout developed in accordance with a method comprising the steps of:
 representing said active elements by a model characterized by a function that is convex in the neighborhood of the operating point of said active elements;
 obtaining information of the output signal timing delay between all of said input ports and each of said output ports;
 selecting an output port from said output ports that, in accordance with said step of obtaining information, develops an output signal that is delayed more than all other output signals of said output ports;
 investigating a subset of said active elements to determine the effect of altering the size of an active element in said subset on the delay of the output signal of said selected output port;
 modifying that active element which, in accordance with said step of investigating, is determined to have the greatest effect on improving said delay of the output signal of said selected output port; and
 returning to said step of obtaining information unless said specified criteria are met.

7. A method for improving the layout design of an electronic circuit having input ports, output ports, and active elements therebetween, with respect to specified criteria, comprising the steps of:
 representing said active elements by a model characterized by a function that is convex in the neighborhood of the operating point of said active elements;
 obtaining information of the output signal timing delay between all of said input ports and each of said output ports;
 selecting an output port from said output ports that, in accordance with said step of obtaining information, develops an output signal that is delayed more than all other output signals of said output ports;
 investigating a subset of said active elements to determine the effect of altering the size of an active element in said subset on the delay of the output signal of said selected output port;
 modifying that active element which, in accordance with said step of investigating, is determined to have the greatest effect on improving said delay of the output signal of said selected output port; and
 returning to said step of obtaining information unless said specified criteria are met.

8. The method of claim 7 wherein said active elements are MOS transistors.

9. The method of claim 7 wherein model characterizes the delay of said active elements by a function that is convex in the area of interest.

10. The method of claim 7 wherein said model is based on a distributed R and C representation of said active elements.

11. The method of claim 10 wherein said model represents delay through one of said active elements in accordance with the equation $Ax + B/x + C$, where A, B, and C are positive constants, x is a size attribute of said active element, and all other size attributes of other active elements in said circuit are held constant.

12. The method of claim 7, further comprising the step of initially assigning a minimum size to all of said transistors.

13. The method of claim 7, further comprising the step of sorting subnetworks of said electronic circuit and selecting the permutation of said subnetworks that most improves the performance of said circuit with respect to said specified criteria.

14. The method of claim 7 wherein said circuit is an MOS VLSI integrated circuit.

15. The method of claim 7 wherein said circuit includes memory elements and said output ports include the set of output signal lines of said circuit and signal lines applied to said memory elements.

16. The method of claim 7 wherein said step of returning includes a step of evaluating performance of said circuit, altered by said step of modifying, with respect to said specified criteria.

17. The method of claim 7 wherein said specified criterion is related to a delay value to be satisfied.

18. The method of claim 7 wherein said specified criterion is related to a circuit area value to be satisfied.

19. A system for altering the layout of at least a portion of an integrated circuit comprising:
 first means, responsive to an applied design specification and to an activation signal from a sixth means, for developing information concerning relative time delays of output signals of said integrated circuit;
 second means, responsive to said first means, for selecting an output of said integrated circuit that develops an output signal more slowly than other outputs of said integrated circuit;
 third, responsive to said second means, means for identifying active elements of said integrated circuit whose size alterations affect the output signal delay of said selected output;
 fourth means, responsive to said third means, for selecting an active element from among the ones singled out by said third means, said active element offering the largest improvement in speed of the signals of said selected output in response to an alteration in the size of said active element, and accordingly modifying the size of that active element;
 fifth means, responsive to said fourth means, for updating said information concerning relative time delays, based on the size modifications called for by said fourth means; and
 sixth means for passing an activation signal to said first means as long as specified criteria are not met.

20. The system of claim 19, further including seventh means, responsive to said sixth means for sorting subnetworks of said integrated circuit that are interconnected in series.

* * * * *